(12) United States Patent
Miwa et al.

(10) Patent No.: US 9,531,382 B1
(45) Date of Patent: Dec. 27, 2016

(54) SEARCH FOR IMPEDANCE CALIBRATION

(71) Applicant: SanDisk Technologies Inc., Plano, TX (US)

(72) Inventors: Hitoshi Miwa, Kamakura (JP); Sravanti Addepalli, Bengaluru (IN); Sridhar Yadala, Bengaluru (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/842,032

(22) Filed: Sep. 1, 2015

(51) Int. Cl.
*H03K 19/003* (2006.01)
*H03K 19/00* (2006.01)

(52) U.S. Cl.
CPC ........ *H03K 19/0005* (2013.01); *H03K 19/003* (2013.01)

(58) Field of Classification Search
None
See application file for complete search history.

(56) References Cited

U.S. PATENT DOCUMENTS

| | | | |
|---|---|---|---|
| 7,164,287 B2 | 1/2007 | Ueno | |
| 7,423,450 B2 | 9/2008 | Santurkar et al. | |
| 7,479,800 B1 * | 1/2009 | Vullaganti | H03K 19/0005 326/21 |
| 7,551,020 B2 | 6/2009 | Bhattacharya et al. | |
| 7,773,440 B2 | 8/2010 | Kim et al. | |
| 7,821,291 B2 | 10/2010 | Mei | |
| 7,839,159 B2 | 11/2010 | Nakamura et al. | |
| 7,888,948 B2 | 2/2011 | Jakobs | |
| 8,036,846 B1 * | 10/2011 | Vullaganti | H03K 19/0005 324/750.03 |
| 8,710,861 B2 | 4/2014 | Kuroki et al. | |
| 2008/0061818 A1 * | 3/2008 | Santurkar | H03K 19/0005 326/30 |
| 2008/0122450 A1 | 5/2008 | Yokou | |
| 2012/0056641 A1 * | 3/2012 | Kuroki | H03K 19/017545 326/30 |
| 2013/0214812 A1 * | 8/2013 | Koo | H03K 19/018571 326/30 |

* cited by examiner

*Primary Examiner* — Crystal L Hammond
(74) *Attorney, Agent, or Firm* — Vierra Magen Marcus LLP

(57) ABSTRACT

A non-volatile storage system includes an impedance code calibration circuit. The device has a first variable impedance circuit and a second variable impedance circuit coupled to a calibration node. The device has a control circuit configured to access a previous impedance code for a previous impedance calibration and to divide the previous impedance code into a main impedance code and a remainder impedance code. The control circuit is configured to perform a search for a new impedance code starting with the main impedance code applied to the first variable impedance circuit while maintaining the remainder impedance code to the second variable impedance circuit. The control circuit is configured to add the final impedance code for the first variable impedance circuit with the remainder impedance code to produce a new impedance code for the impedance calibration.

21 Claims, 12 Drawing Sheets

SEARCH FOR IMPEDANCE CALIBRATION

BACKGROUND

The present technology relates to semiconductors and/or non-volatile memory devices.

Most semiconductor devices include an input circuit configured to receive signals from the outside world via input pads (or pins) and an output circuit configured to provide internal signals to the outside via output pads (or pins). The input circuit has a termination resistor for impedance matching of the external transmission line. The output circuit has an output driver, which has a resistance (Ron). The impedance of both the termination resistor and the output driver can change due to various circumstances such as variation of a power supply voltage, a change in operating temperature, etc. Thus, an impedance mismatch can arise.

The impedance mismatch can cause signal reflection, which can compromise signal integrity. As the operating speed of electrical products has increased, the swing width (that is the difference between high and low logic levels) of a signal interfaced between semiconductor devices gradually has been reduced in order to minimize a delay time taken for signal transmission. However, the reduction in the swing width of the signal easily exposes the signal to external noise, causing signal reflection to become more critical at an interface terminal due to impedance mismatch. Thus, the impedance mismatch may lead to a difficulty in high-speed transmission of data and distortion of output data.

To alleviate impedance mismatch, the device's output drivers and the device's termination resistor are periodically calibrated. For example, just after the device is reset, a ZQ calibration command may be sent to the device. This is referred to as a long ZQ calibration command. After the initial calibration has been performed, a short ZQ calibration command may be sent to the device to update the calibration. Typically, the device is not given as long to complete the short ZQ calibration command, as it is to complete the long ZQ calibration command. It can be challenging for the device to be able to complete the short ZQ calibration command within the time limit.

BRIEF DESCRIPTION OF THE DRAWINGS

Like-numbered elements refer to common components in the different figures.

DETAILED DESCRIPTION

Disclosed herein are techniques for calibrating an impedance code. In one embodiment, a ZQ calibration is performed. In one embodiment, a short ZQ calibration is performed. Techniques disclosed herein perform a fast search for a new impedance code, such that timing constraints are met. Techniques disclosed herein perform an accurate search for a new impedance code, such that accuracy constraints are met.

Figure 1A:
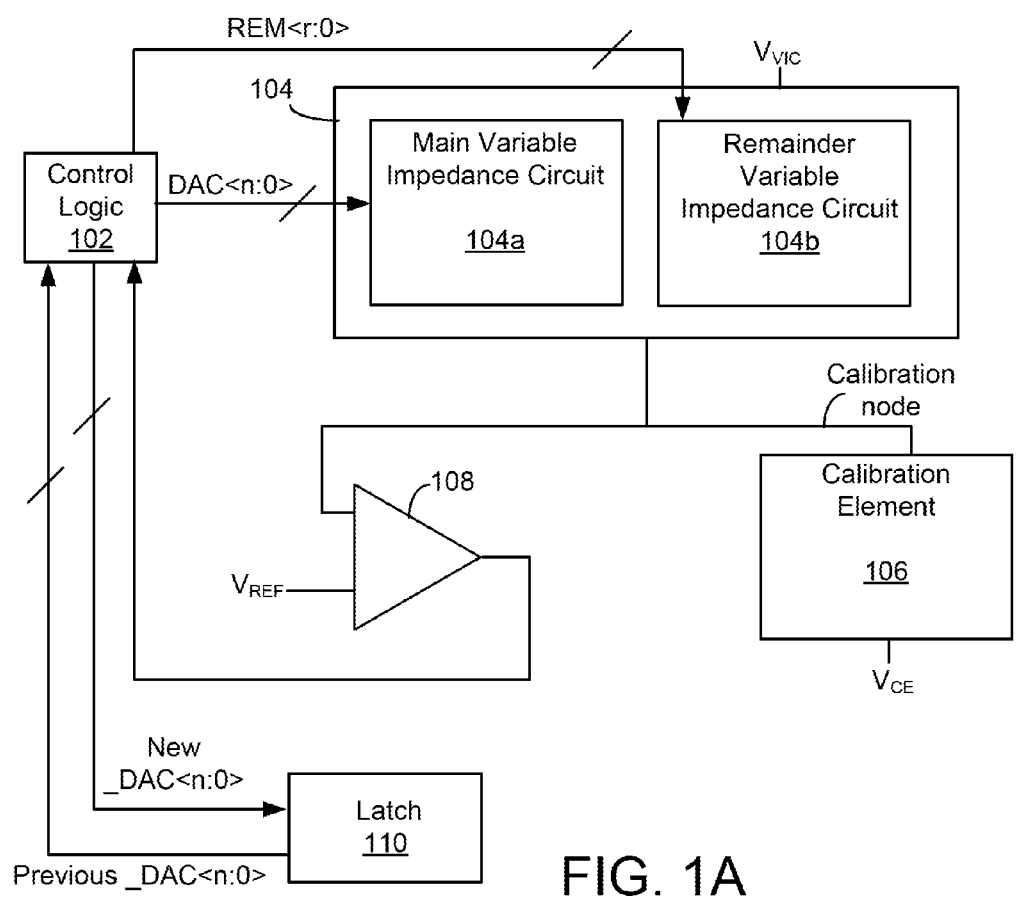
FIG. 1A is a diagram of one embodiment of a circuit for calibrating impedance codes.

FIG. 1A is a diagram of one embodiment of a circuit for calibrating impedance codes. The circuit could be used in a ZQ calibration process to determine, for example, pull-up or pull-down calibration codes.

Variable impedance circuit 104 comprises main variable impedance circuit 104a and remainder variable impedance circuit 104b. Variable impedance circuit 104 is supplied with a variable impedance circuit voltage ($V_{VIC}$). The variable impedance circuit voltage might be ground, a certain fixed positive voltage, or a certain fixed negative voltage. Variable impedance circuit 104 is connected to calibration node. In one embodiment, variable impedance circuits 104a, 104b are each pull-up circuits. In one embodiment, variable impedance circuits 104a, 104b are each pull-down circuits.

The calibration node is located on one side of a calibration element 106. The other side of the calibration element is provided with a calibration element voltage ($V_{CE}$). The calibration element voltage might be ground, a certain fixed positive voltage, or a certain fixed negative voltage. In one embodiment, the calibration element 106 is a high precision reference resistor. In one embodiment, the various components of FIG. 1A are located on a chip, but the reference resistor is located off the chip. The reference resistor may be a high precision resistor to which the variable impedance circuits 104a, 104b are calibrated. In this example, the parallel impedance of main variable impedance circuit 104a and remainder variable impedance circuit 104b is calibrated to the reference resistor. However, the calibration element 106 is not required to be a reference resistor. In one embodiment, the calibration element 106 is a pull-up replica circuit.

The main variable impedance circuit 104a is configured to have its impedance change in response to an impedance code. Likewise, the remainder variable impedance circuit 104b is configured to have its impedance change in response to an impedance code. The impedance of variable impedance circuit 104 may be a function of the impedance of the main variable impedance circuit 104a and the remainder variable impedance circuit 104b. In one embodiment, the impedance of variable impedance circuit 104 is a function of the parallel impedance of the main variable impedance circuit 104a and the remainder variable impedance circuit 104b.

Figure 5A:
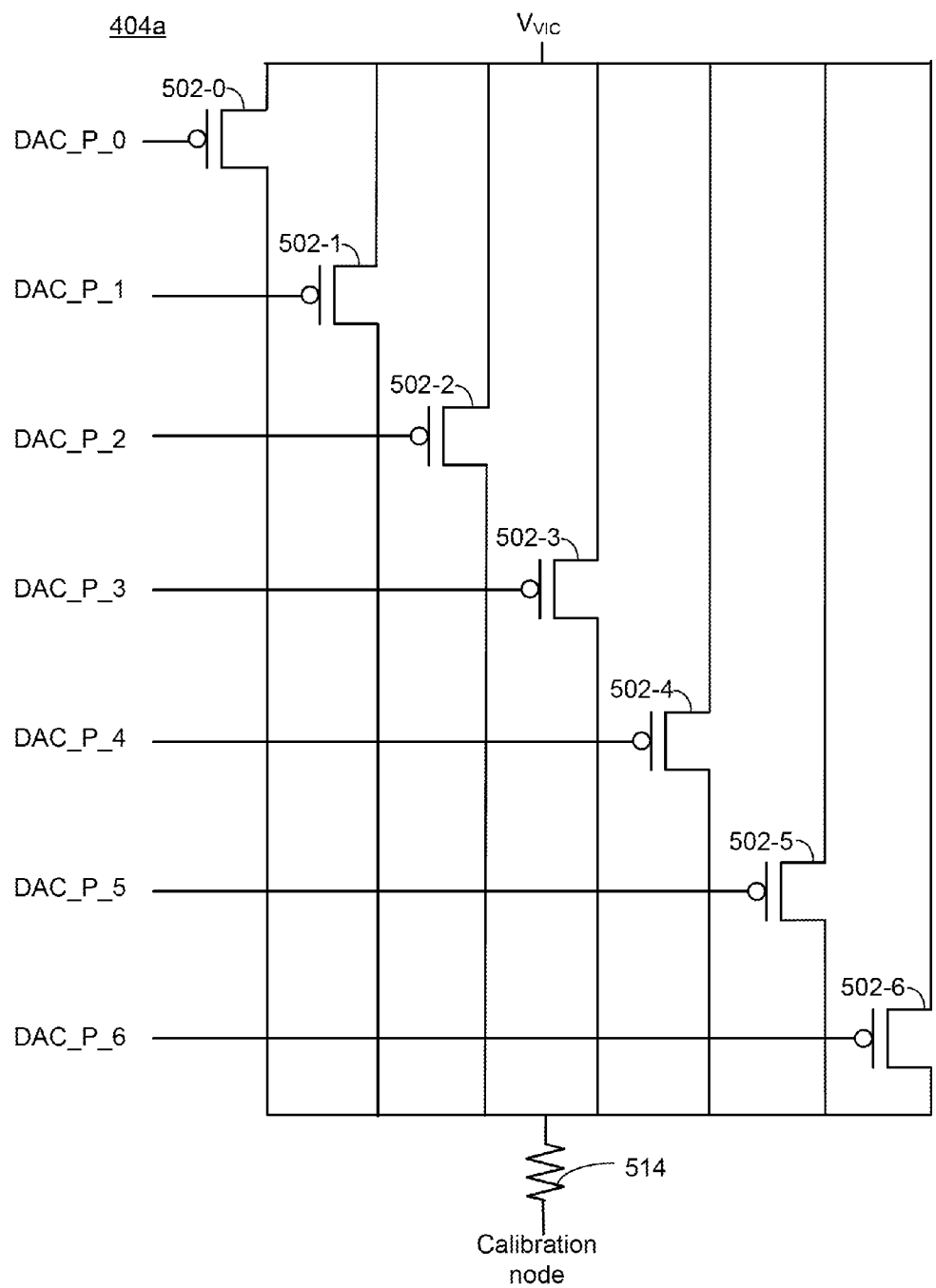
FIG. 5A depicts one embodiment of the main binary weighted pull-up replica of FIG. 4A.
Figure 5B:
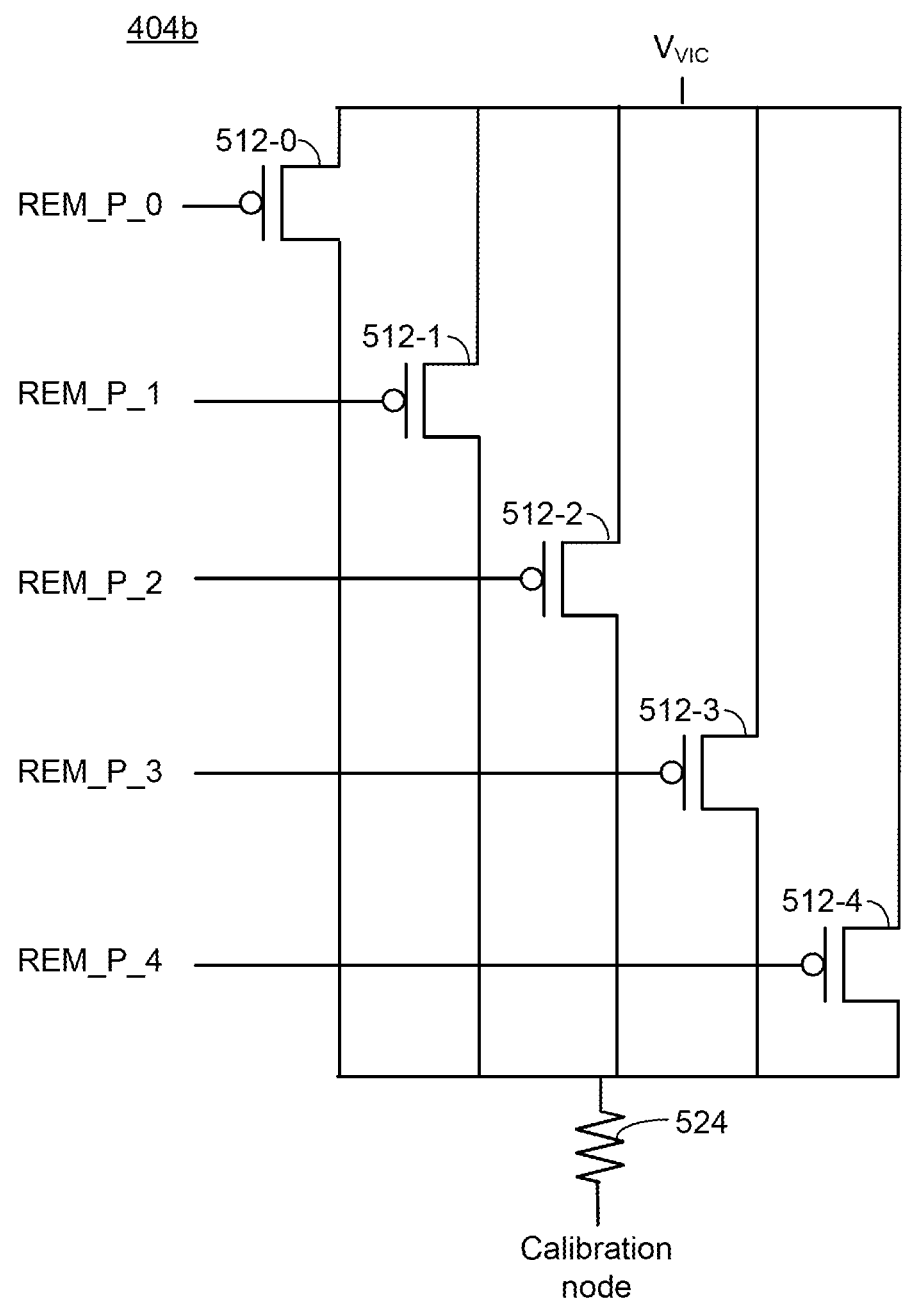
FIG. 5B depicts one embodiment of the remainder binary weighted pull-up replica of FIG. 4A.
Figure 6A:
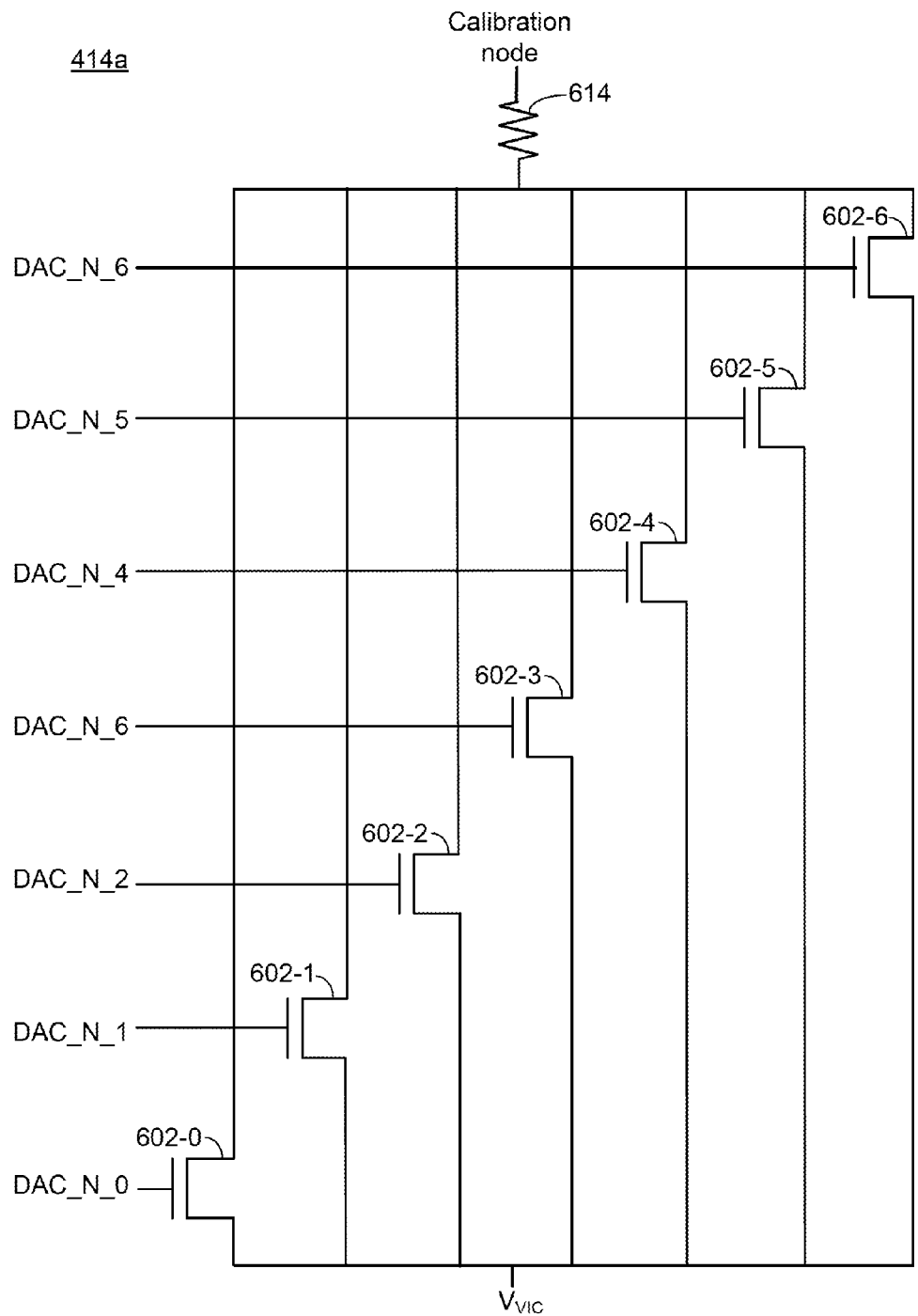
FIG. 6A depicts one embodiment of the main binary weighted pull-down replica 414a of FIG. 4A.
Figure 6B:
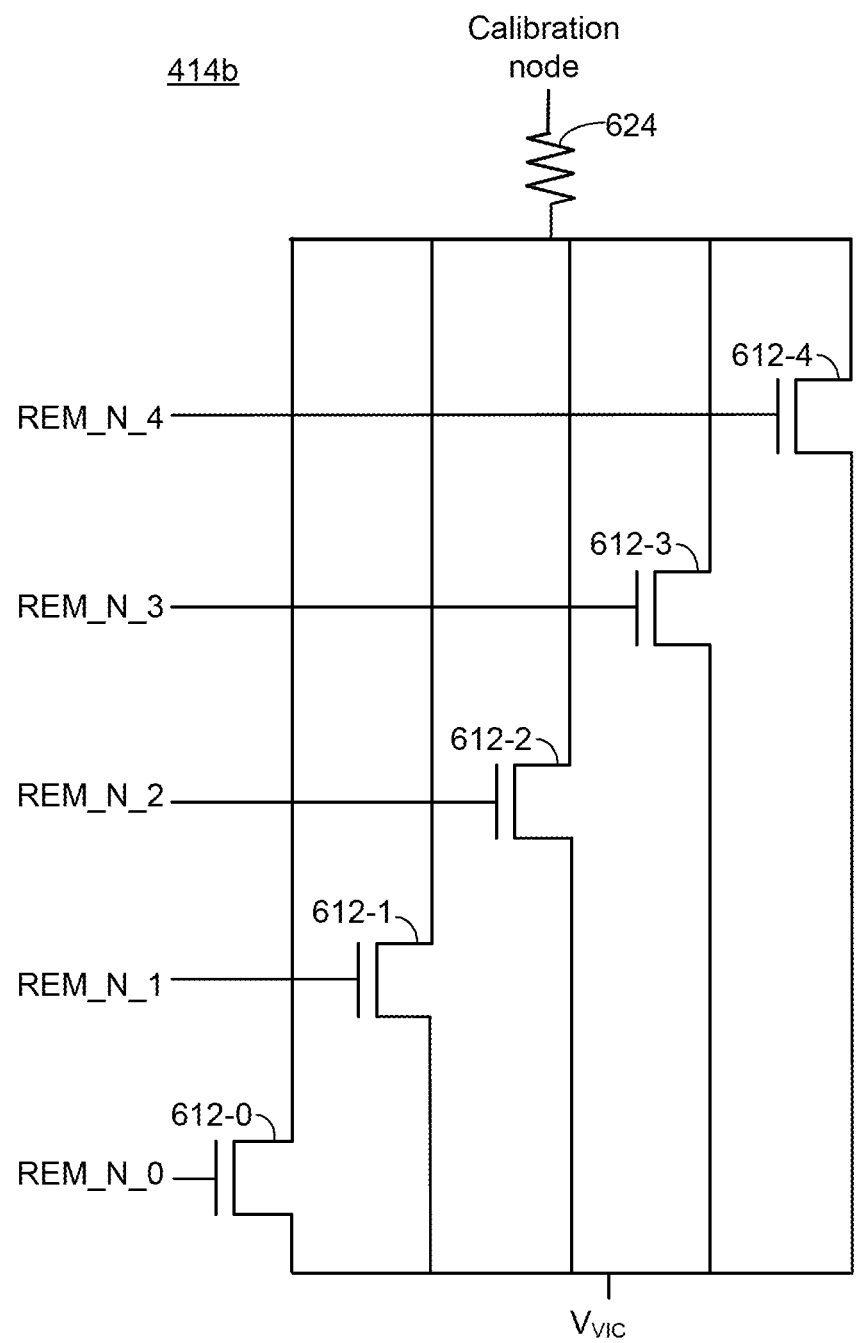
FIG. 6B depicts one embodiment of the remainder binary weighted pull-down replica 414b of FIG. 4A.

Each of the variable impedance circuits 104a, 104b may comprise a number of circuit elements, such as transistors. The variable impedance circuits 104a, 104b turn those transistors on or off in response to their respective impedance code to alter the impedance of the respective circuit 104a, 104b, in one embodiment. In one embodiment, main and remainder variable impedance circuits 104a, 104b are each binary weighted transistor circuits. In one embodiment, the main variable impedance circuit 104a is configured to have $2^n$ different impedances in response to the different values of an "n" bit impedance code. In one embodiment, the remainder variable impedance circuit 104b is configured to have $2^r$ different impedances in response to the different values of an "r" bit impedance code. In one embodiment, "r" is less than "n". FIGS. 5A and 6A provide further details of various embodiments of the main variable impedance circuit 104a. FIGS. 5B and 6B provide further details of various embodiments of the remainder variable impedance circuit 104b.

The control logic 102 provides main impedance code DAC<n:0> to main variable impedance circuit 104a and provides remainder impedance code REM<r:0> to remainder variable impedance circuit 104b. In one embodiment, the control logic 102 keeps the remainder impedance code REM<r:0> constant while changing the main impedance code DAC<n:0>. In this manner, the control logic 102 may control the impedance of the variable impedance circuits 104a, 104b, and hence the voltage at the calibration node.

Comparator 108 compares a reference voltage VREF with the voltage at the calibration node. The comparator 108 may output a signal that indicates whether the voltage at the calibration node is higher or lower than VREF. This signal is fed back to the control logic 102. In one embodiment, VREF equals $V_{VTC}/2$.

The control logic 102 may thus change the value of the main impedance code DAC<n:0> to either increase or decrease the impedance of the main variable impedance circuit 104a, depending on the signal from the comparator 108. In one embodiment, the control logic 102 performs a binary search that involves relatively large step sizes at first and smaller step sizes later. However, as will be explained below, the use of the remainder variable impedance circuit 104b allows the control logic 102 to skip early steps in the search, which speeds the search.

When the search is complete, the control logic 102 determines a New_DAC<n:0> by adding the last DAC<n:0> with the REM<r:0>. This value may be stored in the latch 110. This value may also be provided to a circuit such as an output driver (not depicted in FIG. 1). The next time that an impedance calibration is to be performed, the control logic 102 accesses the New_DAC<n:0> from the last calibration, which is now referred to as the Previous DAC<n:0>. The control circuit 102 determines DAC<n:0> and REM<r:0> from the Previous DAC<n:0>.

Figure 1B:
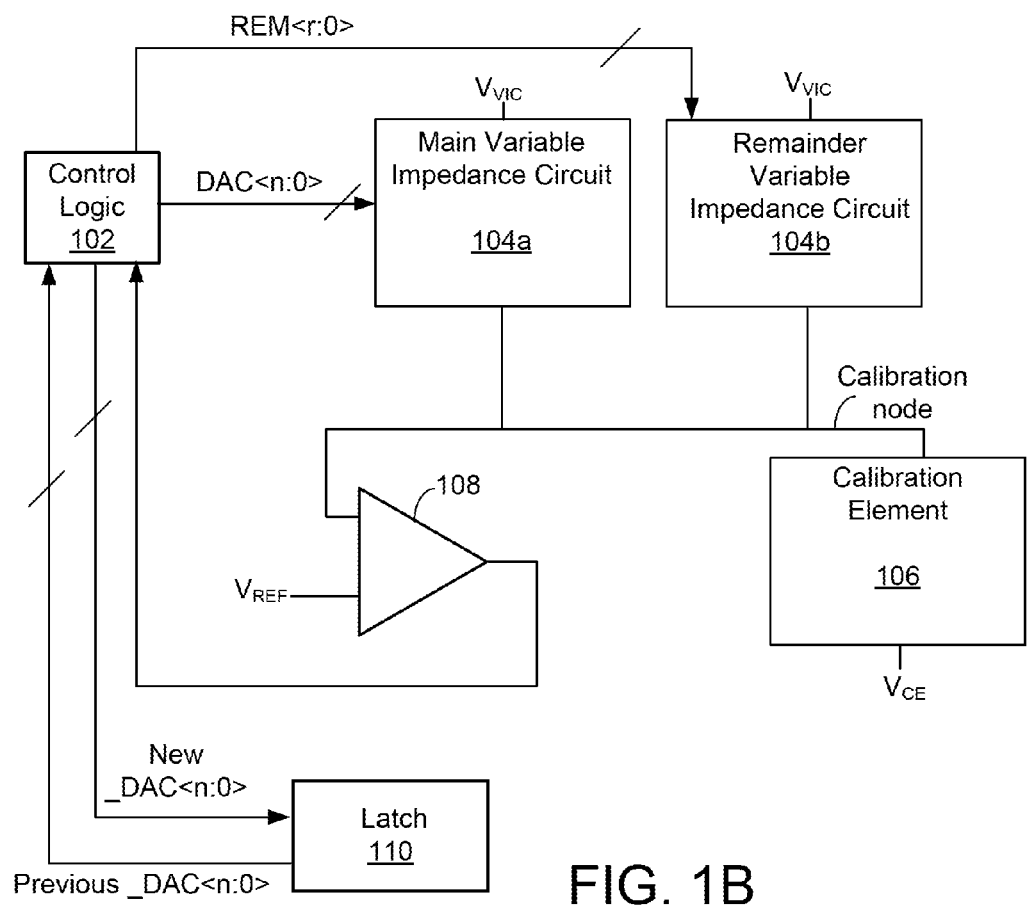
FIG. 1B is a diagram of one embodiment of a circuit for calibrating impedance codes.

FIG. 1B is a diagram of one embodiment of a circuit for calibrating impedance codes. This circuit and its operation is similar to the one in FIG. 1A and will not be described in depth. In FIG. 1B, the main variable impedance circuit 104a and remainder variable impedance circuit 104b are connected in parallel to the calibration node. Both circuits 104a, 104b are supplied with the variable impedance circuit voltage ($V_{VTC}$). The variable impedance circuit voltage might be ground, a certain fixed positive voltage, or a certain fixed negative voltage. In one embodiment, variable impedance circuits 104a, 104b are each pull-up circuits. In one embodiment, variable impedance circuits 104a, 104b are each pull-down circuits.

Figure 2:
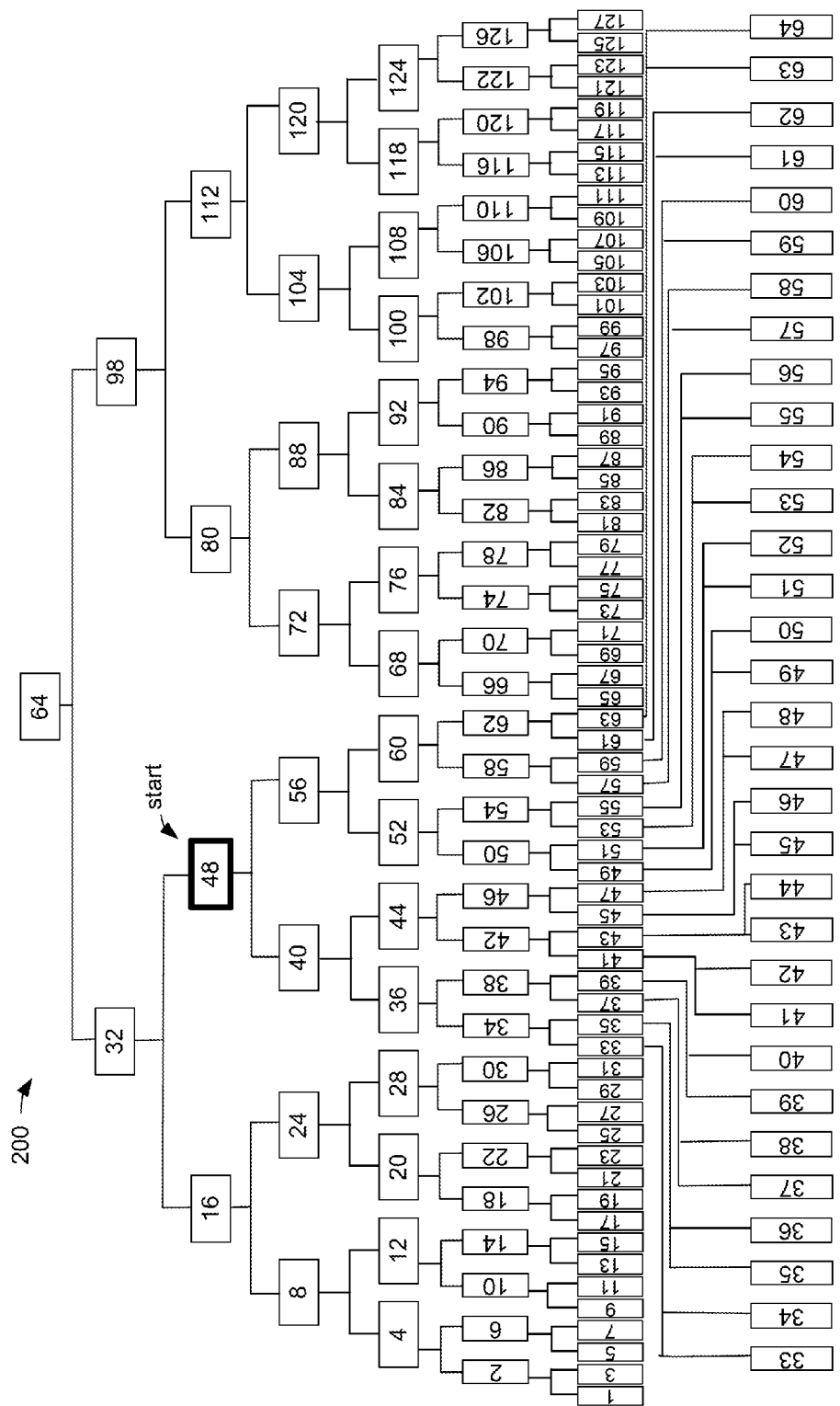
FIG. 2 depicts a binary search tree that may be used when performing a binary search to determine an impedance code.
Figure 3:
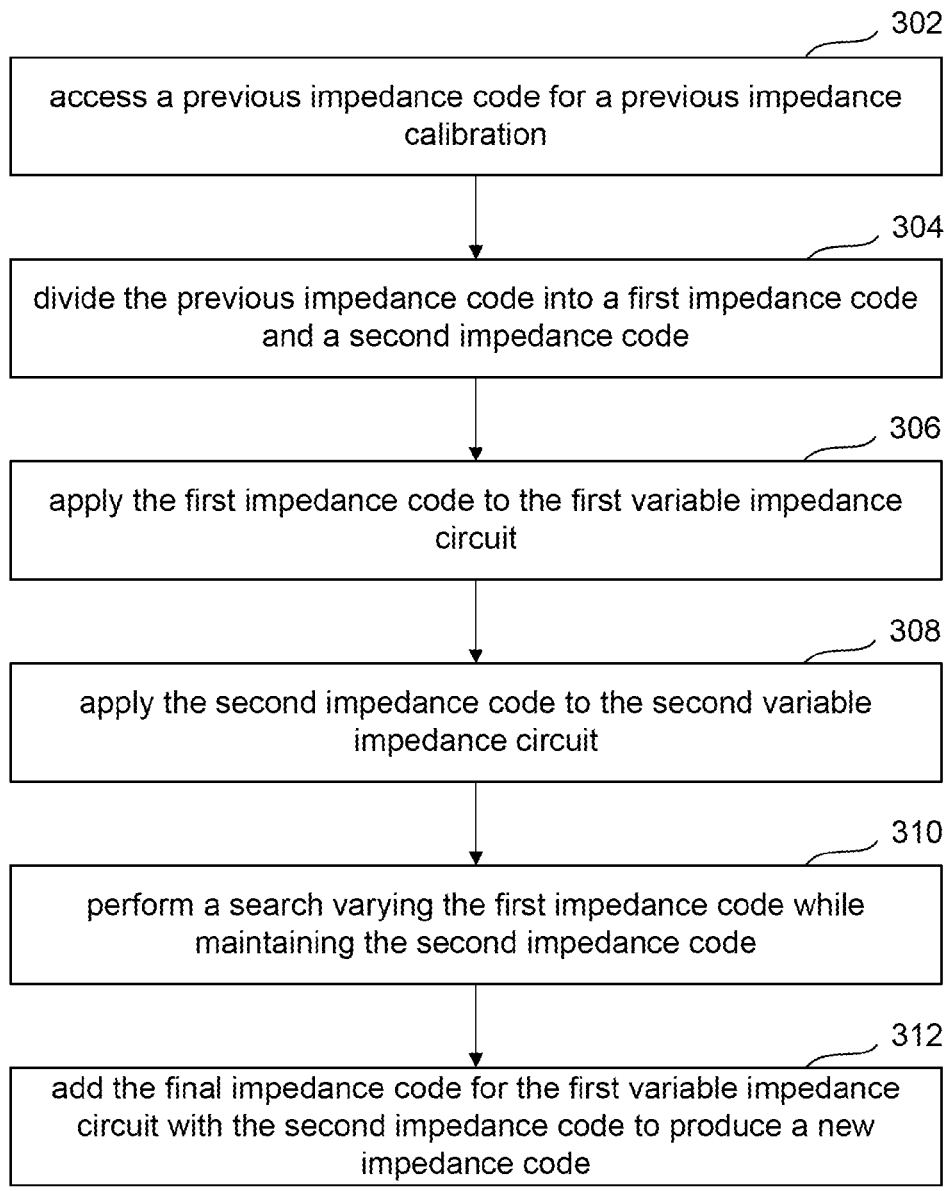
FIG. 3 describes a process of performing an impedance calibration in which both a main variable impedance circuit and a remainder variable impedance circuit are used.

FIG. 2 depicts a binary search tree 200 that may be used by, for example, the control logic 102 of FIG. 1A or 1B when performing a binary search to determine an impedance code. In the example binary search tree 200 each node (but the leaf nodes) has two children. First an example will be discussed of how the binary search tree 200 might be used when using the main variable impedance circuit 104a, but not using the remainder variable impedance circuit 104b of FIG. 1A or 1B. FIG. 3 discusses an embodiment of how the binary search tree 200 might be used when using both the main variable impedance circuit 104a and the remainder variable impedance circuit 104b of FIG. 1A or 1B. Using both the main variable impedance circuit 104a and the remainder variable impedance circuit 104b can speed up the binary search. This helps the circuit to meet timing requirements for finding the new impedance code.

In the example in which only the main variable impedance circuit 104a is used, a full binary search for the new impedance code might be performed. If a full binary search were to be performed, the binary search would start at the top of the search tree using the binary representation of "64" as the impedance code. In this example, the seven bit impedance code "1000000" may be applied to the main variable impedance circuit 104a as the value for DAC_<n:0>. This results in a voltage on the calibration node, depending on the impedance of the main variable impedance circuit 104a relative to the impedance of the calibration element 106, as well as the voltage $V_{VTC}$ supplied to the main variable impedance circuit 104a and the voltage $V_{CE}$ supplied to the calibration element 106. The comparator 108 compares the voltage on the calibration node with its VREF input and outputs a comparison signal to the control logic 102. The control logic 102 then determines the next step in the full binary search based on the comparison. The next step in the full binary search is either "32" or "96" in this example. Thus, in the next step the control logic 102 applies either "0100000" or "1100000" to the main variable impedance circuit 104a as the value for DAC_<n:0>. The full binary search continues in this fashion until an impedance code at the bottom of the binary search tree is found. Note that the full binary search covers the entire range of $2^7$ possible values in the example binary search tree 200.

FIG. 3 describes a process of performing an impedance calibration in which both the main variable impedance circuit 104a and the remainder variable impedance circuit 104b are used. The process may be implemented by the calibration circuits of FIG. 1A or 1B, but is not limited thereto. In one embodiment, the process performs a ZQ calibration. This may be a short ZQ calibration.

In step 302, a previous impedance code is accessed. In one embodiment, the previous impedance code is for a previous impedance calibration. In an embodiment in which ZQ calibration is performed, this may be from either a long ZQ calibration or a previous short ZQ calibration. Referring to FIG. 1A or 1B, the control logic 102 may access Previous DAC<n:0> from Latch 110.

In step 304, the previous impedance code is divided into a first (or main) impedance code and a second (or remainder) impedance code. The main impedance code will be used for DAC<n:0> that is input to the main variable impedance circuit 104a, in one embodiment. The remainder impedance code will be used for the REM<r:0> that is input to the remainder variable impedance circuit 104b, in one embodiment.

The main impedance code is a node from a certain level in a search tree, in one embodiment. As one example, the search tree is a binary search tree. The remainder impedance code is the difference between the main impedance code and the previous impedance code. In one embodiment, an assumption is made that the new impedance code will be within a certain range of the previous impedance code.

The following example will be used to illustrate. Suppose the previous impedance code was 67 (e.g., "1000011"). To be assured that the new impedance code may be found anywhere in the entire range of the binary search tree, one potential option would be to start the search at the top of the search tree. However, this would require seven steps to reach the bottom of the binary search tree. Rather than starting the binary search from the top of the binary search tree, the binary search is started at a lower level of the binary search tree in this embodiment. As one example, the binary search may be started at the third level from the top of the binary search tree. This could be considered to be the third step of a full binary search that would cover the entire range of the binary search tree. Alternatively, the binary search could be started at the second level, fourth level, or even a lower level. Thus, in this example, the main impedance code will be either 16, 48, 80, or 112 (see FIG. 2). The main impedance code may be determined by looking for the closest of those impedance codes (at the selected level of the binary search tree) that is less than or equal to the previous code. For example, 48 is less than or equal to 67. This leaves a remainder of 19, which may serve as the second impedance code.

Note that the binary search does not search the entire range of the binary search tree. Referring to FIG. 3, the example search goes down the path starting at "48". This results in the range of possible values going from 33 to 64. However, when the remainder of 19 is added, the final range is 52 to 83. Note that the final range of 52 to 83 is plus 16 or minus 15 from the previous impedance code of 67. Thus, in this example, an assumption is made that the new impedance code will be within plus 16 or minus 15 of the seven bit previous impedance code. For applications including, but not limited to, a short ZQ calibration, such an assumption provides more than enough accuracy. Note that the binary search could be started even further down the binary search tree 200, to save even more time.

In step 306, the control logic 102 applies the main impedance code to the main variable impedance circuit 104a. Step 306 can also be stated as applying the main impedance code to a first group of variable impedance elements, such as a group of transistors. Thus, in the present example, the control logic 102 applies "0110000" to the main variable impedance circuit 104a as the DAC<n:0>.

In step 308, the control logic 102 applies the remainder impedance code to the remainder variable impedance circuit 104b. Step 308 can also be stated as applying the remainder impedance code to a second group of variable impedance elements, such as a group of transistors. Thus, in the present example, the control logic 102 applies "10011" to the remainder variable impedance circuit 104b as REM<r:0>. In this example, the remainder variable impedance circuit 104a receives a five bit impedance code. However, the remainder impedance code could have more or fewer bits.

In step 310, a search is performed by varying the main impedance code while maintaining the second impedance code. A variety of search algorithms could be performed. The search may be performed by varying the main impedance code. In certain embodiments, the search algorithm used is one for searching a tree data structure. Of course, a search algorithm for searching any collection of elements can be used in embodiments of this solution. Examples of a search algorithm that may be used includes, but is not limited to: a binary search, a dictionary search, a weighted search, a dichotomic search, a Fibonacci search, a linear search, a depth-first search, a breadth-first search, a ternary search, or the like. In an example using a binary search, the impedance code "1000011" applied to the main variable impedance circuit 104a causes the main variable impedance circuit 104a to have a certain impedance. The impedance code "10011" applied to the remainder variable impedance circuit 104b causes the remainder variable impedance circuit 104b to have a certain impedance. Note that the two impedance codes total (or sum) the previous impedance code of 67 ("1000011"). The combined impedance of the main variable impedance circuit 104a and the remainder variable impedance circuit 104b, as viewed from the calibration node, is the equivalent of applying the previous impedance code of 67 ("1000011") to the main variable impedance circuit 104a without using the remainder variable impedance circuit 104b, in one embodiment. This, in effect, allows the binary search to start from the previous impedance code. Under many circumstances the new impedance code is not expected to vary too much from the previous impedance code. For example, it might be expected that the new impedance code is to be within about plus or minus 16 of the previous impedance code. Thus, effectively starting the new binary search from the previous impedance code may result in a fast binary search.

In the embodiment of FIG. 1B, the remainder variable impedance circuit 104b is connected to the calibration node in parallel with the main variable impedance circuit 104a. The voltage ($V_{VIC}$) is applied to both the main variable impedance circuit 104a and the remainder variable impedance circuit 104b. Thus, the voltage on the calibration node will be a function of the parallel impedance of the main variable impedance circuit 104a with the main variable impedance circuit 104a, the impedance of the calibration element 106, as well as the voltages VCE and $V_{VIC}$.

The comparator 108 compares the voltage on the calibration node with its input reference voltage VREF. In one embodiment, VREF is $V_{VIC}/2$ and VCE is ground. However, other values for VREF are possible. The comparator 108 provides a comparison signal to the control logic 102. The control logic 102 determines that next impedance code for the main variable impedance circuit 104a based on the comparison signal. Referring to the binary search tree of FIG. 2, the next impedance code is either "40" or "56", depending on the comparison.

The control logic 102 then applies the next impedance code to the main variable impedance circuit 104a, while maintaining the same impedance code to the remainder variable impedance circuit 104b. For example, control logic 102 then applies, "0101000" to the main variable impedance circuit 104a, while maintaining "10011" the remainder variable impedance circuit 104b. Note that these two impedance codes total 59. In one embodiment, applying the impedance code of 40 to the main variable impedance circuit 104a while applying the impedance code of 19 to the remainder variable impedance circuit 104b is equivalent to applying the impedance code of 59 to the main variable impedance circuit 104a without using the remainder variable impedance circuit 104b. By equivalent it is meant in terms of the impedance as seen from the calibration node.

The control logic 102 continues with the search in this manner until the bottom of the search tree is reached, in one embodiment. For the sake of example, the search might conclude with the last impedance code applied to the main variable impedance circuit 104a being 54 ("0110110").

In step 312, the control logic 102 adds last impedance code that was applied to the main variable impedance circuit 104a with the impedance code that was maintained at the remainder variable impedance circuit 104b. In the present example, 54 is added to 19 to arrive at 73 ("1001001"). This is the new seven bit impedance code. Referring to FIGS. 1A and 1B, this is referred to as the New_DAC<n:0>, which may be stored in Latch 110. The New_DAC<n:0> may also be provided to, for example, an output driver.

Note that the time savings of skipping the early steps of the search may be greater than might first appear. The early steps in the search have relatively large changes in the impedance code. For example, in the example binary search tree 200, the impedance code changes are 32, 16, 8, 4, 2, 1. A larger change in the impedance code may result in a larger change in the voltage on the calibration node between steps. It can take a non-trivial amount of time for this voltage to settle down. Thus, it could take longer to perform one of the early steps. Skipping the early steps thus avoids some steps that potentially could take longer to perform. Note that the process of FIG. 3 is not limited to a binary search.

Figure 4A:
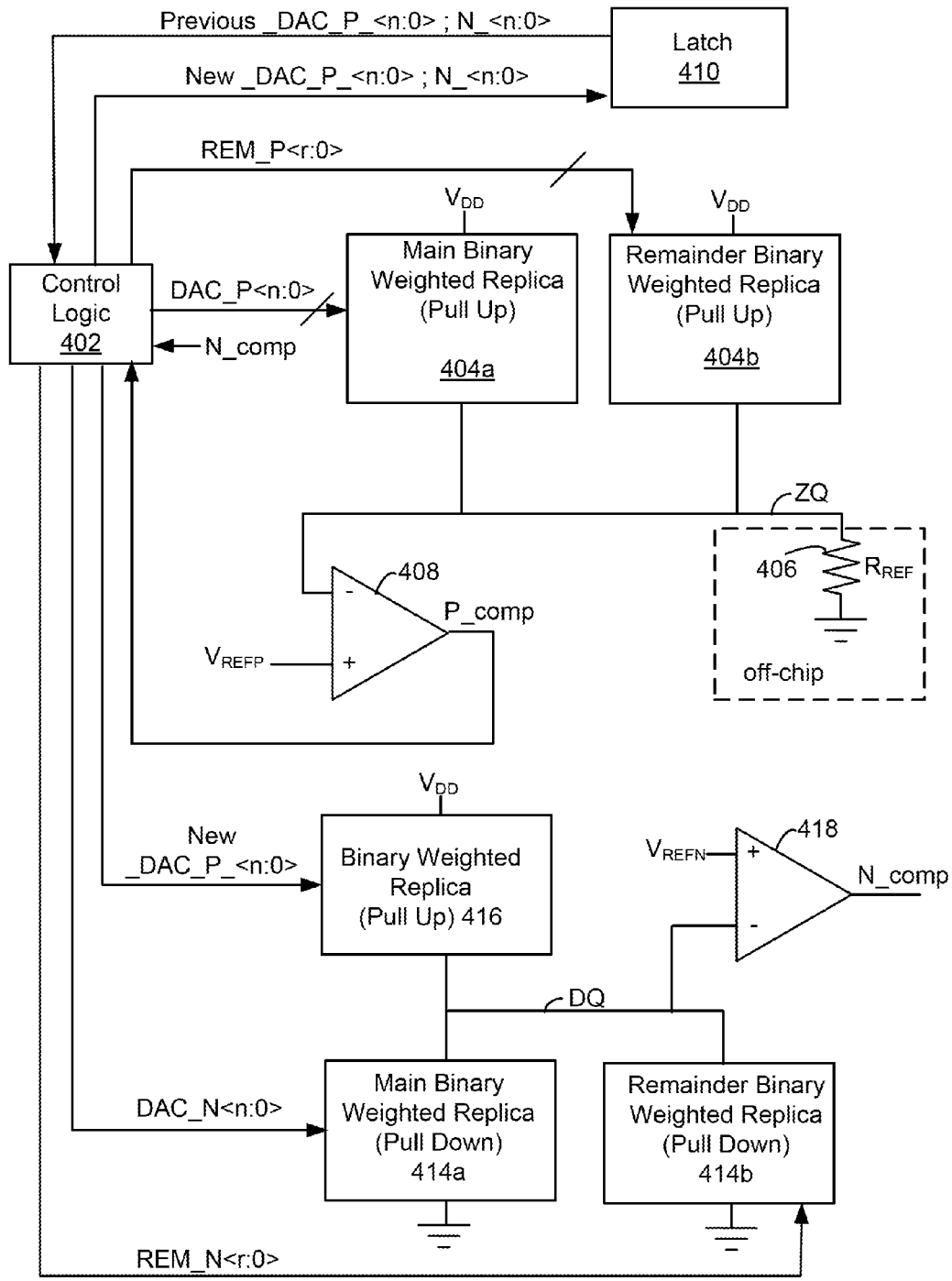
FIG. 4A is a diagram of an embodiment of an impedance code determination circuit having pull-up and pull-down replica circuits.

FIG. 4A is a diagram of an embodiment of an impedance code determination circuit having pull-up and pull-down replica circuits. Some of the elements are one embodiment of corresponding elements in the circuit of FIG. 1B. The main binary weighted pull-up replica 404a is one embodiment of the main variable impedance circuit 104a of FIG. 1B. The remainder binary weighted pull-up replica 404b is one embodiment of the remainder variable impedance circuit 104b of FIG. 1B. Comparator 408 is one embodiment of the comparator 108 of FIG. 1B. In this case, the reference voltage is referred to as VREFP and is input to the non-inverting input of comparator 408. In one embodiment, VREFP is equal to VDD/2. The inverting input of comparator 408 is connected to the ZQ node. The comparator 408 outputs comparison signal P_comp, which is provided to the control logic 402. Reference resistor 406 is one embodiment of the calibration element 106. The reference resistor 406 may be a high precision resistor, which may be located off chip. In one embodiment, reference resistor is 240 Ohms. In FIG. 4A, the ZQ node corresponds to the calibration node of FIG. 1B.

The control logic 402 provides DAC_P<n:0> to the main binary weighted pull-up replica 404a. The control logic 402 provides REM_P<r:0> to the remainder binary weighted pull-up replica 404a. These impedance codes are used in a similar manner as described with respect to the circuits of FIGS. 1A and 1B to perform a search to determine a new impedance code with respect to the ZQ node.

The circuit of FIG. 4A has additional elements that may serve as one embodiment of elements from FIG. 1B. The main binary weighted pull-down replica 414a is one embodiment of the main variable impedance circuit 104a of FIG. 1B. The remainder binary weighted pull-down replica 414b is one embodiment of the remainder variable impedance circuit 104b of FIG. 1B. Comparator 418 is one embodiment of the comparator 108 of FIG. 1B. In this case, the reference voltage is referred to as VREFN and is input to the non-inverting input. In one embodiment, VREFN is equal to VDD/2. The inverting input of comparator 418 is connected to the DQ node. The comparator 418 outputs comparison signal N_comp, which is provided to the control logic 402. Binary weighted pull-up replica 416 is one embodiment of the calibration element 106 of FIG. 1B. The DQ node is one embodiment of the calibration node of FIG. 1B.

Figure 4B:
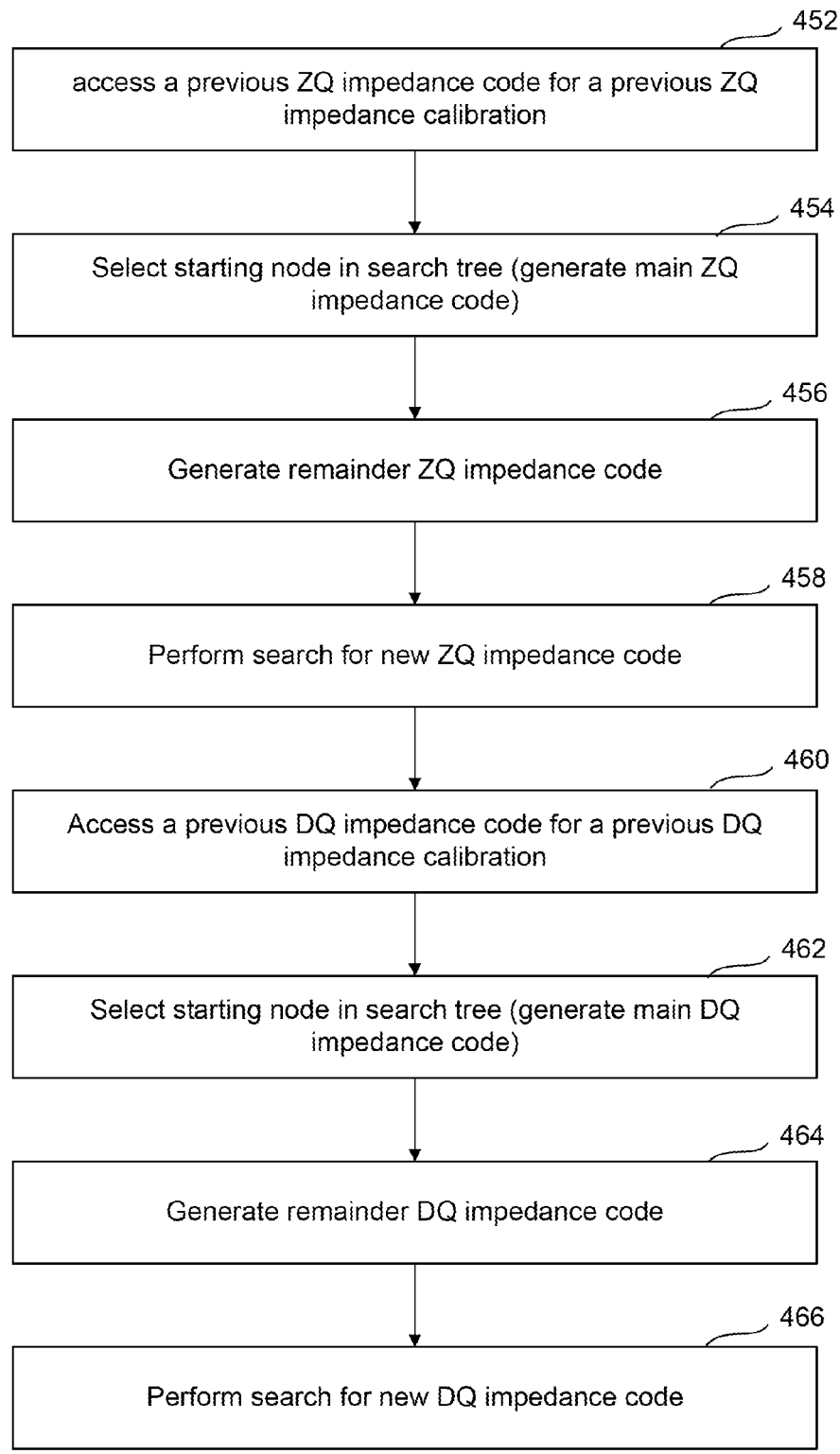
FIG. 4B is a flowchart of one embodiment of determining impedance codes using the circuit of FIG. 4A.

FIG. 4B is a flowchart of one embodiment of determining impedance codes using the circuit of FIG. 4A. In step 452, the control logic 402 accesses a previous ZQ impedance code for a previous ZQ impedance calibration. Referring to FIG. 4A, the control logic 402 accesses Previous_DAC_P<n:0> from Latch 410.

In step 454, the control logic 402 selects a starting node in a search tree such as binary search tree 200 for the search for a new ZQ impedance code. This step also serves to generate a main ZQ impedance code. The main ZQ impedance code will serve as the initial value of DAC_P<n:0> that is applied to the main weighted replica pull-up circuit 404a. In step 456, the control logic 402 generates a remainder ZQ impedance code. The remainder ZQ impedance code will serve as the initial value of REM_P<r:0> that is applied to the remainder weighted replica pull-up circuit 404b. Steps 456-456 are one embodiment of steps 304 of FIG. 3. Thus, these steps will not be discussed in detail.

In step 456, the control logic 402 performs a search for the new ZQ impedance code. This is a binary search, in one embodiment. This is one embodiment of steps 308-312 of FIG. 3. Since an example of a search has already been described, step 456 will not be described in detail. In step 456, the control logic 402 may first apply the initial value of DAC_P<n:0> to main binary weighted pull-up replica 404a and REM_P<r:0> to remainder binary weighted pull-up replica 404b. Then, the value of value of DAC_P<n:0> is changed until the search is complete. The final DAC_P<n:0> that was applied to main binary weighted pull-up replica 404a is added to REM_P<r:0> to produce the final ZQ impedance code. This is referred to as New_DAC_P<n:0>. The value of New_DAC_P<n:0> may be stored in Latch 410. Thus, steps 452-458 together form one embodiment of the process of FIG. 3.

The process of FIG. 4B then continues to perform another search for a DQ impedance code, as reflected by steps 460-468. This is a binary search, in one embodiment. In step 460, the control logic accesses a previous DQ impedance code for a previous DQ impedance calibration. Referring to FIG. 4A, the control logic accesses Previous DAC_N<n:0> from Latch 410. In practice, this step may be performed when performing step 452.

In step 462, the control logic 402 selects a starting node in a search tree such as binary search tree 200 for the search for a new DQ impedance code. This step also serves to generate a main DQ impedance code. The main DQ impedance code will serve as the initial value of DAC_N<n:0> that is applied to the main weighted replica pull-down circuit 414a. In step 464, the control logic generates a remainder DQ impedance code. The remainder DQ impedance code will serve as the initial value of REM_N<r:0> that is applied to the remainder weighted replica pull-down circuit 414b. Steps 462-464 are one embodiment of step 304 of FIG. 3. Thus, these steps will not be discussed in detail.

In step 466, the control logic 402 performs a search for the new DQ impedance code. This is a binary search, in one embodiment. This is one embodiment of steps 308-312 of FIG. 3. Since an example of a search has already been described, step 466 will not be described in detail. In step 466, the control logic 402 applies the final ZQ impedance code that was found in step 458 to the binary weighted pull-up replica 416. For example, New_DAC_P_<n:0> is applied.

In step 466, the control logic 402 may first apply the initial value of DAC_N<n:0> to main binary weighted pull-down replica 414a and REM_N<r:0> to remainder binary weighted pull-up replica 414b. Then, the value of value of DAC_N<n:0> is changed until the search is complete. The final DAC_N<n:0> that was applied to main binary weighted pull-down replica 414a is added to REM_N<r:0> to produce the final DQ impedance code. This is referred to as New_DAC_N<n:0>. The value of New_DAC_N<n:0> may be stored in Latch 410. Thus, steps 460-466 together form one embodiment of the process of FIG. 3.

FIG. 5A depicts one embodiment of the main binary weighted pull-up replica 404a of FIG. 4A. This circuit 404a may also be used for binary weighted pull-up replica 416 of FIG. 4A. This circuit 404a also may be used for main variable impedance circuit 104a of FIG. 1A or 1B. This circuit 404a, and other herein, is referred to as a "replica" because it may replicate another circuit in the device. For example, the main binary weighted pull-up replica 404a may replicate a portion of an output driver. The main binary weighted pull-up replica 404a includes transistors 502-0, 502-1, 502-2, 502-3, 502-4, 502-5, and 502-6. In one embodiment, the transistors 502 are p-channel transistors. One terminal of each transistor 502 is connected to the supply voltage $V_{VTC}$. Note that $V_{VTC}$ is referred to as $V_{DD}$ in FIG. 4A with respect to both main binary weighted pull-up replica 404a and binary weighted pull-up replica 416. Another terminal of each transistor is connected to a resistor 514. The resistor 514 is connected to the calibration node. Note that the calibration node is referred to as ZQ in FIG. 4A with respect to main binary weighted pull-up replica 404a. Note that the calibration node is referred to as DQ in FIG. 4A with respect to binary weighted pull-up replica 416.

Each of the transistors 502 has its gate controlled by one of the bits of the impedance code DAC_P<n:0>. Transistor 502-0 has its gate controlled by DAC_P_0, which refers to the least significant bit of DAC_P<n:0>. Transistor 502-1 has its gate controlled by DAC_P_1. Transistor 502-2 has its gate controlled by DAC_P_2. Transistor 502-3 has its gate controlled by DAC_P_3. Transistor 502-4 has its gate controlled by DAC_P_4. Transistor 502-5 has its gate controlled by DAC_P_5. Transistor 502-6 has its gate controlled by DAC_P_6, which is the most significant bit of DAC_P<n:0>.

The transistors may be "binary weighted" such that transistor 502-0 has a weight of "1", transistor 502-1 has a weight of "2", transistor 502-2 has a weight of "4", transistor 502-3 has a weight of "8", transistor 502-4 has a weight of "16", transistor 502-5 has a weight of "32", and transistor 502-6 has a weight of "64". By the weight it is meant the impact the transistor has on the impedance of the main binary weighted pull-up replica 404a.

In one embodiment, the transistors 502 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 502 of the main binary weighted pull-up replica 404a is implemented by multiple transistors. Thus, it will be understand that each of the transistors 502 may represent one or more transistors. Moreover, there could be a binary relationship between the number of transistors used to implement transistors 502-0 through 502-6. For example, transistor 502-0 might be implemented with a single transistor, transistor 502-1 might be implemented with two transistors, transistor 502-2 might be implemented with four transistors, etc. In this example, each of the implementation transistors might have the same W/L.

FIG. 5B depicts one embodiment of the remainder binary weighted pull-up replica 404b of FIG. 4A. The circuit may also be used for the remainder variable impedance circuit (FIG. 1A or 1B, 104b). The remainder binary weighted replica 404b includes transistors 512-0, 512-1, 512-2, 512-3, and 512-4. In one embodiment, transistors 512 are p-channel transistors. One terminal of each transistor 512 is connected to the supply voltage $V_{VTC}$. Note that $V_{VTC}$ is referred to as $V_{DD}$ in FIG. 4A. Another terminal of each transistor is connected to a resistor 524. The resistor 524 is connected to the calibration node. Note that the calibration node is referred to ZQ in FIG. 4A. The resistor 524 has the same impedance of resistor 514 of the main binary weighted pull-up replica 404a, in one embodiment.

Each of the transistors has its gate controlled by one of the bits of the impedance code REM_P<r:0>. Transistor 512-0 has its gate controlled by REM_P_0, which refers to the least significant bit of REM_P<r:0>. Transistor 512-1 has its gate controlled by REM_P_1. Transistor 502-2 has its gate controlled by REM_P_2. Transistor 502-3 has its gate controlled by REM_P_3. Transistor 502-4 has its gate controlled by REM_P_4, which is the most significant bit of REM_P<r:0>.

The transistors may be "binary weighted" such that transistor 512-0 has a weight of "1", transistor 512-1 has a weight of "2", transistor 512-2 has a weight of "4", transistor 512-3 has a weight of "8", transistor 512-4 has a weight of "16", transistor 512-5 has a weight of "32".

The transistors 512 in the remainder binary weighted replica 404b are similar in their impact on impedance as corresponding transistors 205 in the main binary weighted pull-up replica 404a, in one embodiment. For example, transistor 512-0 may be similar in configuration to transistor 502-0, transistor 512-1 may be similar in configuration to transistor 502-1, transistor 512-2 may be similar in configuration to transistor 502-2, transistor 512-3 may be similar in configuration to transistor 502-3, and transistor 512-4 may be similar in configuration to transistor 502-4. Thus, the discussion of W/L, as well as number of implementation transistors for the main binary weighted pull-up replica 404a applies to the remainder binary weighted replica 404b.

Moreover, the transistors 512 in the remainder binary weighted replica 404b may be similar in their impact on impedance as corresponding transistors in the main binary weighted pull-up replica 404a, in one embodiment. For example, transistor 512-0 may have a similar impact on impedance as transistor 502-0, transistor 512-1 may have a similar impact on impedance as transistor 502-1, etc. Note that if the same impedance code is input to the remainder binary weighted replica 404b, as is input to the main binary weighted pull-up replica 404a that similar transistors would be on/off. The transistors 502, 512 may be configured such that if the same impedance code were to be input to each replica 404a, 404b, the respective replicas would have the same impedance. For example, inputting a code of "100100" to the remainder binary weighted replica 404b may result in the same impedance for the remainder binary weighted replica 404b as inputting "00100100" to the main binary weighted pull-up replica 404a has for the main binary weighted pull-up replica 404a.

FIG. 6A depicts one embodiment of the main binary weighted pull-down replica 414a of FIG. 4A. Note that the circuit of FIG. 6A could also be used to implement that main variable impedance circuit 104a of FIG. 1A or 1B. The main binary weighted pull-down replica 414a may replicate a portion of an output driver. The main binary weighted pull-down replica 414a includes transistors 602-0, 602-1, 602-2, 602-3, 602-4, 602-5, and 602-6. In one embodiment, transistors 602 are n-channel transistors. One terminal of each transistor 602 is connected to the voltage $V_{VTC}$. Note that $V_{VTC}$ is depicted as ground in FIG. 4A. Another terminal of each transistor is connected to a resistor 614. The resistor 614 is connected to the calibration node. Note that the calibration node is referred to DQ in FIG. 4A. Note that in another embodiment, rather than having the resistor 614 connect to a DQ node, resistor 614 could connect to a ZQ node. Thus, resistor 614 could connect to an off-chip reference resistor, such as reference resistor 406 in FIG. 4A (with a suitable supply voltage for the off-chip reference resistor).

Each of the transistors 602 has its gate controlled by one of the bits of the impedance code DAC_N<n:0>. Transistor 602-0 has its gate controlled by DAC_N_0, which refers to the least significant bit of DAC_P<n:0>. Transistor 602-1 has its gate controlled by DAC_N_1. Transistor 602-2 has its gate controlled by DAC_N_2. Transistor 602-3 has its gate controlled by DAC_N_3. Transistor 602-4 has its gate controlled by DAC_N_4. Transistor 602-5 has its gate controlled by DAC_N_5. Transistor 602-6 has its gate controlled by DAC_N_6, which is the most significant bit of DAC_N<n:0>.

The transistors may be "binary weighted" such that transistor 602-0 has a weight of "1", transistor 602-1 has a weight of "2", transistor 602-2 has a weight of "4", transistor 602-3 has a weight of "8", transistor 602-4 has a weight of "16", transistor 602-5 has a weight of "32", and transistor 602-6 has a weight of "64". By the weight it is meant the impact the transistor has on the impedance of the main binary weighted pull-up replica 404a.

In one embodiment, the transistors 602 have a binary weighted channel width-to-length ratio (W/L). For example, the binary weighted channel W/L may be 1×, 2×, 4×, 8×, 16×, 32×, and 64×. The transistor W/L may also be referred to as transistor sizes.

In one embodiment, a transistor 602 of the main binary weighted pull-down replica 414a is implemented by multiple transistors. Thus, it will be understand that each of the transistors 602 may represent one or more transistors. Moreover, there could be a binary relationship between the number of transistors used to implement transistors 602-0 through 602-6. For example, transistor 602-0 might be implemented with a single transistor, transistor 602-1 might be implemented with two transistors, transistor 602-2 might be implemented with four transistors, etc. In this example, each of the implementation transistors might have the same W/L.

FIG. 6B depicts one embodiment of the remainder binary weighted pull-down replica 414b of FIG. 4A. The circuit 414b may also be used as the remainder variable impedance circuit (FIG. 1A or 1B, 104b). The remainder binary weighted pull-down replica 414b includes transistors 612-0, 612-1, 612-2, 612-3, and 612-4. In one embodiment, transistors 612 are n-channel transistors. One terminal of each transistor 612 is connected to the voltage $V_{VIC}$. Note that $V_{VIC}$ is depicted as ground in FIG. 4A. Another terminal of each transistor is connected to a resistor 624. The resistor 624 is connected to the calibration node, which is referred to as the DQ node in FIG. 4A. The resistor 624 could alternatively be connected to a ZQ node. The resistor 624 has the same impedance of resistor 614 of the main binary weighted pull-down replica 414a, in one embodiment.

Each of the transistors 612 has its gate controlled by one of the bits of the impedance code REM_N<r:0>. Transistor 612-0 has its gate controlled by REM_N_0, which refers to the least significant bit of REM_N<r:0>. Transistor 612-1 has its gate controlled by REM_N_1. Transistor 602-2 has its gate controlled by REM_N_2. Transistor 602-3 has its gate controlled by REM_N_3. Transistor 602-4 has its gate controlled by REM_N_4, which is the most significant bit of REM_N<r:0>.

The transistors may be "binary weighted" such that transistor 612-0 has a weight of "1", transistor 612-1 has a weight of "2", transistor 612-2 has a weight of "4", transistor 612-3 has a weight of "8", transistor 612-4 has a weight of "16", transistor 612-5 has a weight of "32".

The transistors 612 in the remainder binary weighted replica 414b are similar in their impact on impedance as corresponding transistors 602 in the main binary weighted pull-down replica 414a, in one embodiment. For example, transistor 612-0 may be similar in configuration to transistor 602-0, transistor 612-1 may be similar in configuration to transistor 602-1, transistor 612-2 may be similar in configuration to transistor 602-2, transistor 612-3 may be similar in configuration to transistor 602-3, and transistor 612-4 may be similar in configuration to transistor 602-4. The discussion of W/L, as well as number of implementation transistors for the main binary weighted pull-up replica 404a, applies to the remainder binary weighted pull-down replica 404b.

Moreover, the transistors 612 in the remainder binary weighted pull-down replica 414b may be similar in their impact on impedance as corresponding transistors in the main binary weighted pull-down replica 414a, in one embodiment. For example, transistor 612-0 may have a similar impact on impedance as transistor 602-0, transistor 612-1 may have a similar impact on impedance as transistor 602-1, etc. Note that if the same impedance code is input to the remainder binary weighted pull-down replica 414b, as is input to the main binary weighted pull-down replica 404a that similar transistors would be on/off. The transistors 602, 612 may be configured such that if the same impedance code were to be input to each pull-down replica 414a, 414b, the respective replicas would have the same impedance. For example, inputting a code of "100100" to the remainder binary weighted pull-down replica 414b may result in the same impedance for the remainder binary weighted pull-down replica 414b as inputting "00100100" to the main binary weighted pull-down replica 414a has for the main binary weighted pull-down replica 414a.

Note that the examples in FIGS. 5A and 6A are for cases in which the main impedance code is seven bits. If the main impedance code is greater or less than seven bits, then a corresponding change may be made to the number of transistors in FIGS. 5A and 6A. Similarly, the examples in FIGS. 5B and 6B are for cases in which the remainder impedance code is five bits. If the remainder impedance code is greater or less than five bits, then a corresponding change may be made to the number of transistors in FIGS. 5B and 6B.

Figure 7:
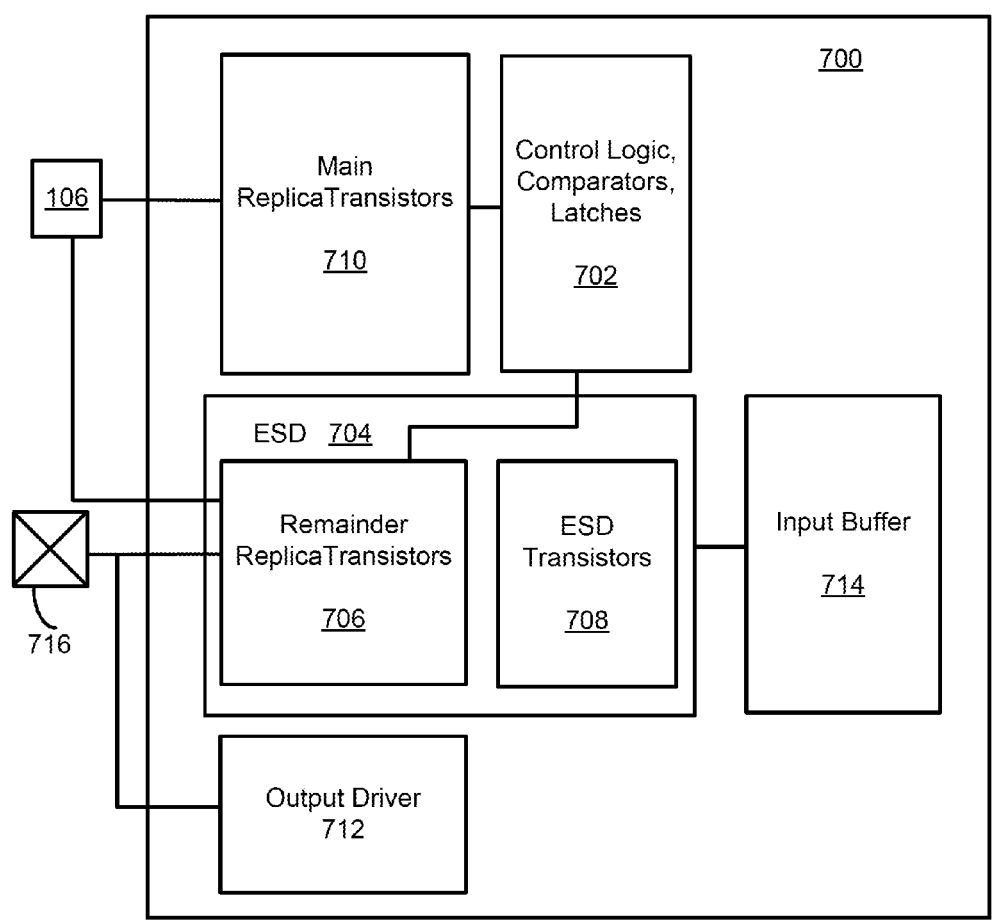
FIG. 7 is a diagram of one embodiment a device having ESD circuitry.

In one embodiment, the remainder variable impedance circuit is implemented as part of circuitry that provides protection from electro-static discharge (ESD). This saves chip real estate. FIG. 7 is a diagram that shows one embodiment of I/O circuity 700, which includes ESD protection. The ESD circuity 704 includes remainder replica transistors 706 and ESD protection transistors 708. The remainder replica transistors 706 could include, for example, the circuits of FIGS. 5B and 6B. The ESD circuity 704 is connected to I/O pin/pad 716, which may be an input/output pad or pin. Thus, together remainder replica transistors 706 and ESD protection transistors 708 provide ESD protection.

The output driver 712 is also connected to the I/O pin/pad 716. The output driver 712 includes pull-up transistors and pull-down transistors, in one embodiment. The main replica transistors 710 include replicas of the pull-up and pull-down transistors in one embodiment. The main replica transistors 710 include replicas a portion of the pull-up and pull-down transistors in one embodiment. The main replica transistors 706 could include, for example, the circuits of FIGS. 5A and 6B.

Control logic, comparators, and latches 702 (hereinafter "control logic 702") may be implemented with control logic 102, comparator 108, and latch 110 of FIG. 1A or 1B. As another example, control logic 702 may be implemented with control logic 402, comparators 408, 418, and latch 410 of FIG. 4A. Control logic 702 is connected to main replica transistors 710 and to remainder replica transistors 706, which are each connected to the calibration element 106. The calibration element 106 may be off-chip and may be a high-precision resistor. The control logic 702 determines impedance codes, as discussed herein, and provides them to the output driver 712, in one embodiment. Thus, the impedance of the output driver 712 may be adjusted to account for environmental and operating conditions. In one embodiment, control logic 702 provides impedance codes to the input buffer 714 to be used, for example, for termination impedance. For example, a termination impedance of the input buffer 714 may be adjusted to account for environmental and operating conditions.

In some embodiments, the impedance calibration circuit is part of a memory device. The following discussion provides details of the structure of example memory devices which can implement the proposed technology for determining impedance codes.

Figure 8A:
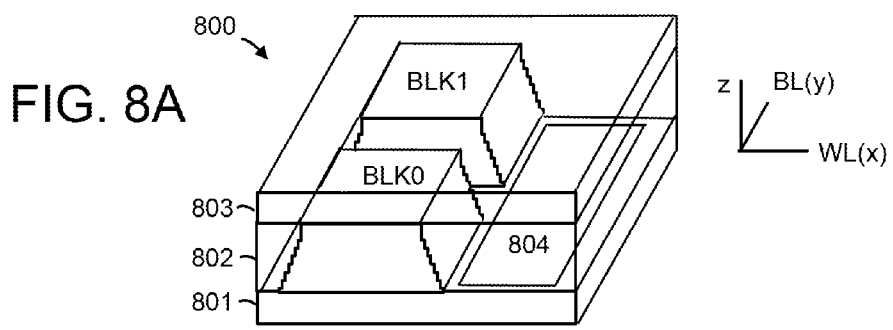
FIG. 8A is a perspective view of a 3D stacked non-volatile memory device in which embodiments may be practiced.

FIG. 8A is a perspective view of a 3D stacked non-volatile memory device. The memory device 800 includes a substrate 801. On and above the substrate are example blocks BLK0 and BLK1 of memory cells (non-volatile storage elements). Also on the substrate is a peripheral area 804 with circuitry for use by the blocks. The substrate 801 can also carry circuitry under the blocks, along with one or more lower metal layers which are patterned in conductive paths to carry signals of the circuitry. The blocks are formed in an intermediate region 802 of the memory device. In an upper region 803 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions. Additionally, note that components are considered to be connected if they are directly connected or indirectly connected.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 8B:
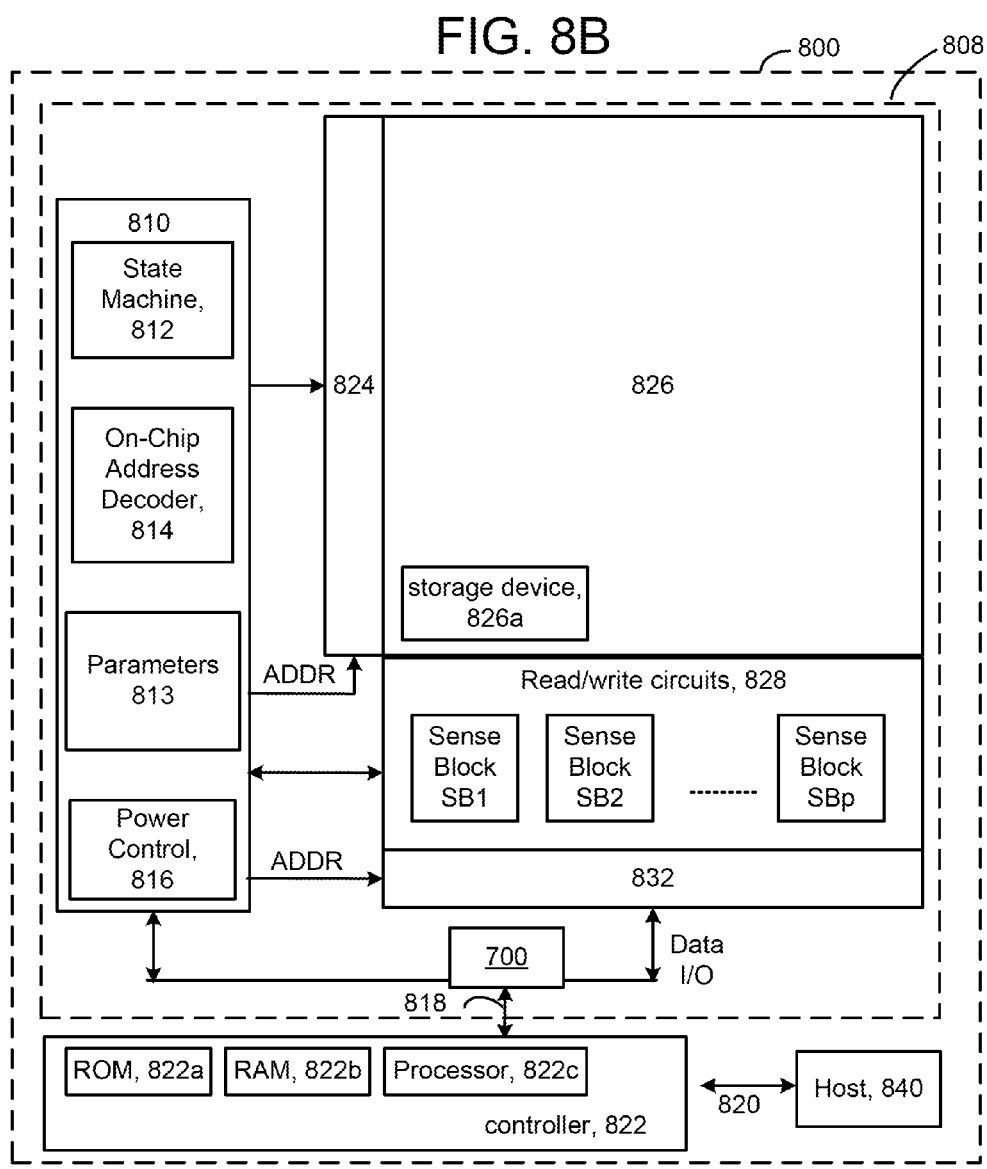
FIG. 8B is a functional block diagram of a memory device such as the 3D stacked non-volatile memory device of FIG. 8A.

FIG. 8B is a functional block diagram of a memory device 800 such as the 3D stacked non-volatile memory device 800 of FIG. 8A. The memory device 800 may include one or more memory die 808. The memory die 808 includes a memory structure 826 of memory cells, such as an array of memory cells, control circuitry 810, and read/write circuits 828. In a 3D configuration, the memory structure can include the blocks BLK0 and BLK1 of FIG. 8A. The memory structure 826 is addressable by word lines via a row decoder 824 and by bit lines via a column decoder 832. The read/write circuits 828 include multiple sense blocks SB1, SB2, . . . , SBp (sensing circuitry) and allow a page of memory cells to be read or programmed in parallel. Typically a controller 822 is included in the same memory device 800 (e.g., a removable storage card) as the one or more memory die 808. In some embodiments, one controller will communicate with multiple memory die. Commands and data are transferred between the host 840 and controller 822 via a data bus 820 and between the controller and the one or more memory die 808 via lines 818. The memory die has I/O circuitry 700 such as depicted in FIG. 7, in one embodiment.

Memory structure 826 can be a two dimensional structure or a three dimensional structure of memory cells (e.g., NAND flash memory cells). The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 810 cooperates with the read/write circuits 828 to perform memory operations on the memory structure 826, and includes a state machine 812, an on-chip address decoder 814, and a power control module 816. The state machine 812 provides chip-level control of memory operations. Parameter storage 813 may be provided for storing operational parameters The on-chip address decoder 814 provides an address interface between that used by the host or a memory controller to the hardware address used by the decoders 824 and 832. The power control module 816 controls the power and voltages supplied to the word lines and bit lines during memory operations. It can include drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In various embodiments, one or more of control circuitry 810, state machine 812, decoders 814/824/832, power control module 816, sense blocks SB1, SB2, . . . , SBp, read/write circuits 828, and controller 822 can be thought of as at least one or more control circuits.

The off-chip controller 822 may comprise a processor 822c and storage devices (memory) such as ROM 822a and RAM 822b. The storage devices comprises code such as a set of instructions, and the processor 822c is operable to execute the set of instructions to provide the functionality described herein. Alternatively or additionally, processor 822c can access code from a storage device 826a of the memory structure, such as a reserved area of memory cells in one or more word lines.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND flash memory) typically contain memory elements connected in series. A NAND string is an example of a set of series-connected transistors comprising memory cells and select gate transistors.

A NAND flash memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One embodiment disclosed herein includes a device comprising a calibration node, a variable impedance circuit coupled to the calibration node, wherein the variable impedance circuit comprises first variable impedance elements and second variable impedance elements, and a control circuit coupled to the variable impedance circuit. The control circuit is configured to divide a previous impedance code into a first impedance code and a second impedance code. The control circuit is configured to apply the first impedance code to the first variable impedance elements. The control circuit is configured to apply the second impedance code to the second variable impedance elements. The control circuit is configured to calibrate an impedance of the variable impedance circuit with respect to the calibration node, wherein the control circuit is configured to perform a search starting with the first impedance code applied to the first variable impedance elements while maintaining the second impedance code to the second variable impedance elements. The search results in a final impedance code for the first variable impedance elements. The control circuit is configured to add the final impedance code with the second impedance code to produce a new impedance code for the impedance calibration of the variable impedance circuit with respect to the calibration node.

One embodiment disclosed herein includes a method that comprises: accessing a previous impedance code for a previous impedance calibration associated with a calibration node, dividing the previous impedance code into a first impedance code and a second impedance code, applying the first impedance code to a first variable impedance circuit coupled to the calibration node, applying the second impedance code to a second variable impedance circuit coupled to the calibration node, performing a binary search to calibrate an impedance of the first and second variable impedance circuits to the calibration node, wherein the binary search changes the first impedance code applied to the first variable impedance circuit while maintaining the second impedance code applied to the second variable impedance circuit, wherein the binary search concludes in a final impedance code for the first variable impedance circuit, and adding the final impedance code for the first variable impedance circuit with the second impedance code to produce a new impedance code associated with a calibration node.

One embodiment disclosed herein includes a device that comprises a ZQ calibration node, a first binary weighted replica circuit coupled to the ZQ calibration node, a second binary weighted replica circuit coupled to the ZQ calibration node, and a control circuit coupled to the first binary weighted replica circuit and to the second binary weighted replica circuit. The control circuit is configured to access a ZQ impedance code for a previous ZQ calibration, divide the ZQ impedance code into a first impedance code and a second impedance code, perform a binary search in which the control circuit is configured to maintain the second impedance code to the second binary weighted replica circuit and to start a binary search with the first impedance code applied to the first binary weighted replica circuit, wherein the binary search results in a final impedance code for the first binary weighted replica circuit, and add the final impedance code for the first binary weighted replica circuit with the second impedance code to produce a new ZQ calibration code.

One embodiment disclosed herein includes a device comprising a calibration node, a first means coupled to the calibration node and for generating a variable impedance in response to a first impedance code, a second means coupled to the calibration node and for generating a variable impedance in response to a second impedance code, and a third means coupled to the first means and to the second means. The third means is for accessing a previous impedance code for a previous impedance calibration associated with the first and second variable impedance circuits. The third means is for dividing the previous impedance code into a first impedance code and a second impedance code. The third means is for applying the first impedance code to the first variable impedance circuit. The third means is for applying the second impedance code to the second variable impedance circuit. The third means is for calibrating an impedance of the first and second variable impedance circuits with respect to the calibration node. The third means is for performing a binary search starting with the first impedance code applied to the first variable impedance circuit while maintaining the second impedance code to the second variable impedance circuit, wherein the binary search results in a final impedance code for the first variable impedance circuit. The third means is for adding the final impedance code for the first variable impedance circuit with the second impedance code to produce a new impedance code for the impedance calibration associated with the first and second variable impedance circuits.

One embodiment includes a device comprising: a three-dimensional memory array comprising non-volatile storage elements; a calibration node coupled to the three-dimensional memory array; a first variable impedance circuit coupled to the calibration node; a second variable impedance circuit coupled to the calibration node; and a control circuit coupled to the first variable impedance circuit and to the second variable impedance circuit. The control circuit divides a previous impedance code into a first impedance code and a second impedance code, wherein the previous impedance code is for a previous impedance calibration associated with the first and second variable impedance circuits. The control circuit applies the first impedance code to the first variable impedance circuit. The control circuit applies the second impedance code to the second variable impedance circuit. The control circuit calibrates an impedance of the first and second variable impedance circuits with respect to the calibration node, wherein the control circuit performs a binary search starting with the first impedance code applied to the first variable impedance circuit while maintaining the second impedance code to the second variable impedance circuit, wherein the binary search results in a final impedance code for the first variable impedance circuit. The control circuit adds the final impedance code for the first variable impedance circuit with the second impedance code to produce a new impedance code for the impedance calibration of the first and second variable impedance circuits with respect to the calibration node.

One of skill in the art will recognize that this technology is not limited to the two dimensional and three dimensional exemplary structures described but covers all relevant memory structures within the spirit and scope of the technology as described herein and as understood by one of skill in the art. The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A device comprising:
   a calibration node;
   a variable impedance circuit coupled to the calibration node, wherein the variable impedance circuit comprises first variable impedance elements and second variable impedance elements; and
   a control circuit coupled to the variable impedance circuit, wherein the control circuit is configured to:
      divide a previous impedance code into a first impedance code and a second impedance code;
      apply the first impedance code to the first variable impedance elements;
      apply the second impedance code to the second variable impedance elements;
      calibrate an impedance of the variable impedance circuit with respect to the calibration node, wherein the control circuit is configured to perform a search starting with the first impedance code applied to the first variable impedance elements while maintaining the second impedance code to the second variable impedance elements, wherein the search results in a final impedance code for the first variable impedance elements; and
      add the final impedance code with the second impedance code to produce a new impedance code for the impedance calibration of the variable impedance circuit with respect to the calibration node.

2. The device of claim 1, wherein the previous impedance code is for a previous impedance calibration associated with the variable impedance circuit, wherein the sum of the first impedance code and the second impedance code equals the previous impedance code.

3. The device of claim 1, wherein the first variable impedance elements are configured to have $2^n$ different impedances in response to the different values of an "n" bit impedance code, wherein the first impedance code is a value from an mth step of a full binary search that would cover an entire range of the $2^n$ different impedances, wherein "m" is greater than one.

4. The device of claim 1, further comprising an output driver, wherein the first variable impedance elements are a replica circuit of the output driver, wherein the second variable impedance elements are a replica circuit of a portion of the output driver, wherein the control circuit is further configured to provide the new impedance code to the output driver.

5. The device of claim 1, wherein the first variable impedance elements are configured to have $2^n$ different impedances in response to an "n" bit impedance code, wherein the second variable impedance elements are configured to have $2^r$ different impedances in response to an "r" bit impedance code, wherein "r" is less than "n", wherein the $2^r$ different impedances of the second variable impedance elements match the corresponding different impedances of the first variable impedance elements when the r bit impedance code is applied to the first variable impedance elements.

6. The device of claim 1, further comprising electrostatic discharge (ESD) protection transistors, wherein the ESD protection transistors comprise the second variable impedance elements.

7. The device of claim 1, wherein:
   the first variable impedance elements comprise a pull-up circuit;
   the second variable impedance elements comprise a pull-up circuit; and
   the calibration node comprises a ZQ node that is coupled to a reference impedance.

8. The device of claim 1, further comprising a pull-up circuit in series with the first variable impedance elements, wherein:
   the first variable impedance elements comprise a pull-down circuit;
   the second variable impedance elements comprise a pull-down circuit; and
   the calibration node comprises a node (DQ) between the pull-up circuit and the first variable impedance elements.

9. A method comprising:
   accessing a previous impedance code for a previous impedance calibration associated with a calibration node;
   dividing the previous impedance code into a first impedance code and a second impedance code;
   applying the first impedance code to a first variable impedance circuit coupled to the calibration node;
   applying the second impedance code to a second variable impedance circuit coupled to the calibration node;
   performing a binary search to calibrate an impedance of the first and second variable impedance circuits to the calibration node, wherein the binary search changes the first impedance code applied to the first variable impedance circuit while maintaining the second impedance code applied to the second variable impedance circuit, wherein the binary search concludes in a final impedance code for the first variable impedance circuit; and
   adding the final impedance code for the first variable impedance circuit with the second impedance code to produce a new impedance code associated with the calibration node.

10. The method of claim 9, wherein the first impedance code and the second impedance code sum to the previous impedance code.

11. The method of claim 9, wherein the first variable impedance circuit is configured to have $2^n$ different impedances in response to the different values of an "n" bit impedance code, wherein performing the binary search comprises:
   starting the binary search at an mth step of a full binary search that would cover an entire range of the $2^n$ different impedances, wherein "m" is greater than one.

12. The method of claim 9, further comprising an output driver, wherein the first variable impedance circuit is replica circuit of the output driver, wherein the second variable impedance circuit is a replica circuit of a portion of the output driver, and further comprising:
   providing the new impedance code to the output driver.

13. The method of claim 9, wherein the first variable impedance circuit is configured to have $2^n$ impedance values in response to an "n" bit impedance code, wherein the second variable impedance circuit is configured to have $2^r$ impedance values in response to an "r" bit impedance code, wherein "r" is less than "n", wherein the $2^r$ impedance values of the second variable impedance circuit match the corresponding impedance values of the first variable impedance circuit when the r bit impedance code is applied to the first variable impedance circuit.

14. A device comprising:
   a ZQ calibration node;
   a first binary weighted replica circuit coupled to the ZQ calibration node;
   a second binary weighted replica circuit coupled to the ZQ calibration node; and a control circuit coupled to the first binary weighted replica circuit and to the second binary weighted replica circuit, wherein the control circuit is configured to:
   access a ZQ impedance code for a previous ZQ calibration;
   divide the ZQ impedance code into a first impedance code and a second impedance code;
   perform a binary search in which the control circuit is configured to maintain the second impedance code to the second binary weighted replica circuit and to start a binary search with the first impedance code applied to the first binary weighted replica circuit, wherein the binary search concludes with a final impedance code for the first binary weighted replica circuit; and
   add the final impedance code for the first binary weighted replica circuit with the second impedance code to produce a new ZQ calibration code.

15. The device of claim 14, wherein the first impedance code and the second impedance code total to the ZQ impedance code for a previous ZQ calibration.

16. The device of claim 14, wherein the first binary weighted replica circuit is configured to have $2^n$ different impedance values in response to an "n" bit impedance code, wherein the control circuit being configured to perform the binary search comprises the control circuit being configured to skip the first "m" steps of a full binary search that would cover an entire range of the $2^n$ different impedances, wherein "m" is at least one.

17. The device of claim 14, wherein the first binary weighted replica circuit is configured to have $2^n$ different impedances in response to an "n" bit impedance code, wherein the second binary weighted replica circuit is configured to have $2^r$ different impedances in response to an "r" bit impedance code, wherein the first impedance code is an "n" bit code, wherein the second impedance code is an "r" bit code, wherein "r" is less than "n", wherein the $2^r$ different impedances of the second binary weighted replica circuit match the corresponding different impedances of the first binary weighted replica circuit when the r bit impedance code is applied to the first binary weighted replica circuit.

18. The device of claim 14, further comprising electrostatic discharge (ESD) protection transistors, wherein the ESD protection transistors comprise the second binary weighted replica circuit.

19. The device of claim 14, wherein:
   the first binary weighted replica circuit comprises a pull-up circuit;
   the second binary weighted replica circuit comprises a pull-up circuit; and
   the ZQ calibration node comprises a ZQ node that is coupled to a reference impedance.

20. The device of claim 14, further comprising a pull-up circuit in series with the first binary weighted replica circuit, wherein:
   the first binary weighted replica circuit comprises a pull-down circuit;
   the second binary weighted replica circuit comprises a pull-down circuit; and
   the ZQ calibration node comprises a node between the pull-up circuit and the first binary weighted replica circuit.

21. A device comprising:
   a calibration node;
   a first means coupled to the calibration node and for generating a variable impedance in response to a first impedance code;
   a second means coupled to the calibration node and for generating a variable impedance in response to a second impedance code; and
   a third means coupled to the first means and to the second means, wherein the third means is for:
      accessing a previous impedance code for a previous impedance calibration associated with the first and second means;
      dividing the previous impedance code into a first impedance code and a second impedance code;
      applying the first impedance code to the first means;
      applying the second impedance code to the second means;
      calibrating an impedance of the first and second means with respect to the calibration node, wherein the third means is for performing a binary search starting with the first impedance code applied to the first means while maintaining the second impedance code to the second means, wherein the binary search results in a final impedance code for the first means; and
      adding the final impedance code for the first means with the second impedance code to produce a new impedance code for the impedance calibration of the first and second means with respect to the calibration node.

* * * * *